United States Patent
Yamane et al.

(10) Patent No.: US 8,742,519 B2
(45) Date of Patent: Jun. 3, 2014

(54) MAGNETIC STORAGE ELEMENT AND MAGNETIC MEMORY

(75) Inventors: Kazutaka Yamane, Kanagawa (JP); Masanori Hosomi, Tokyo (JP); Hiroyuki Ohmori, Kanagawa (JP); Kazuhiro Bessho, Kanagawa (JP); Yutaka Higo, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 428 days.

(21) Appl. No.: 13/150,995

(22) Filed: Jun. 1, 2011

(65) Prior Publication Data
US 2012/0001281 A1 Jan. 5, 2012

(30) Foreign Application Priority Data
Jun. 30, 2010 (JP) .................. 2010-150179

(51) Int. Cl.
*H01L 29/82* (2006.01)
*G11C 11/15* (2006.01)

(52) U.S. Cl.
USPC ............ 257/421; 257/E29.323; 365/158; 365/171; 365/173

(58) Field of Classification Search
USPC ........... 257/421, E29.323; 365/158, 171, 173
See application file for complete search history.

(56) References Cited

U.S. PATENT DOCUMENTS

| 6,956,766 B2 | 10/2005 | Nakamura et al. |
| 2005/0078510 A1* | 4/2005 | Jeong et al. .................. 365/158 |
| 2008/0080102 A1* | 4/2008 | Ibusuki et al. ............. 360/324.2 |

FOREIGN PATENT DOCUMENTS

JP 2004-193595 7/2004

OTHER PUBLICATIONS

J. C. Slonczewski; Current-driven excitation of magnetic multilayers; Journal of Magnetism and Magnetic Materials; 159; 1996; L1-L7.

* cited by examiner

*Primary Examiner* — Calvin Lee
*Assistant Examiner* — Scott Stowe
(74) *Attorney, Agent, or Firm* — Dentons US LLP

(57) ABSTRACT

Disclosed herein is a magnetic storage element including: a reference layer configured to have a magnetization direction fixed to a predetermined direction; a recording layer configured to have a magnetization direction that changes due to spin injection in a direction corresponding to recording information; an intermediate layer configured to separate the recording layer from the reference layer; and a heat generator configured to heat the recording layer. A material of the recording layer is such a magnetic material that magnetization at 150° C. is at least 50% of magnetization at a room temperature and magnetization at a temperature in a range from 150° C. to 200° C. is in a range from 10% to 80% of magnetization at a room temperature.

7 Claims, 6 Drawing Sheets

MAGNETIC STORAGE ELEMENT AND MAGNETIC MEMORY

BACKGROUND

The present disclosure relates to non-volatile magnetic storage element and magnetic memory that perform information recording by spin injection magnetization reversal.

The dynamic random access memory (DRAM), which is a high-density recording memory capable of high-speed operation, is widely used as a random access memory in various kinds of information apparatus such as computers. However, the DRAM is a volatile memory, in which information is lost when the power supply is turned off. Therefore, it is desired to put into practical use a non-volatile memory that has performance equivalent to that of the DRAM and is free from the information loss. As a candidate for the non-volatile memory, a magnetic random access memory (MRAM) to record information based on the magnetization of a magnetic material is attracting attention and its development is being advanced.

The methods for recording of the MRAM include a method of reversing magnetization by a current magnetic field and a spin injection magnetization reversal method of causing magnetization reversal by injecting spin-polarized electrons directly into the recording layer as described in e.g. Japanese Patent Laid-open No. 2004-193595. This method is attracting attention because the recording current can be made smaller as the element size becomes smaller.

SUMMARY

However, in the magnetic memory utilizing the above-described spin injection magnetization reversal method, recording information changes due to thermal fluctuation and a problem occurs in the recording retention capability if the element size is reduced. To avoid this problem of the lowering of the information retention characteristic due to thermal fluctuation, it will be important to take a countermeasure such as increasing the film thickness of the recording layer.

The current Ic necessary to cause magnetization reversal by spin injection is generally represented by the following equation (1) (refer to J. C. Slonzewski, Journal of Magnetism and Magnetic Materials, Volume 159 (1996) L1).

$$Ic = \alpha \cdot e \cdot \gamma \cdot Ms \cdot V \cdot H_{\mathit{eff}}/(g \cdot \mu_B) \tag{1}$$

In this equation, $\alpha$ denotes the damping constant, e denotes the charge of an electron, $\gamma$ denotes the gyro constant, Ms denotes the saturation magnetization of the magnetic layer whose magnetization rotates. Further, $H_{\mathit{eff}}$ denotes the effective magnetic field acting on the magnetic layer, such as an anisotropic magnetic field (Ha) due to magnetic anisotropy and an external magnetic field, V denotes the volume of the magnetic layer, g denotes the spin injection efficiency, $\mu_B$ denotes the Bohr magneton.

As is apparent from this equation (1), there is a problem that increasing the volume V of the magnetic layer increases the current Ic necessary for spin injection magnetization reversal and leads to increase in the power consumption. Furthermore, the increase in the power consumption causes increase in the size of the drive transistor, which makes it difficult to enhance the recording density of the magnetic memory.

There is a desire for the present disclosure to reduce the current necessary to cause magnetization reversal by spin injection without lowering the information retention characteristic.

According to an embodiment of the present disclosure, there is provided a magnetic storage element including a reference layer configured to have a magnetization direction fixed to a predetermined direction, a recording layer configured to have a magnetization direction that changes due to spin injection in a direction corresponding to recording information, an intermediate layer configured to separate the recording layer from the reference layer, and a heat generator configured to heat the recording layer. A material of the recording layer is such a magnetic material that magnetization at 150° C. is at least 50% of magnetization at a room temperature and magnetization at a temperature in the range from 150° C. to 200° C. is in the range from 10% to 80% of magnetization at a room temperature.

According to another embodiment of the present disclosure, there is provided a magnetic memory including the magnetic storage element having the above-described configuration. Specifically, this magnetic memory includes a magnetic storage element configured to include a reference layer having a magnetization direction fixed to a predetermined direction, a recording layer having a magnetization direction that changes due to spin injection in a direction corresponding to recording information, an intermediate layer that separates the recording layer from the reference layer, and a heat generator that heats the recording layer. Furthermore, the magnetic memory includes two kinds of interconnects configured to intersect with each other, and the magnetic storage element is disposed near the intersection of two kinds of interconnects and between two kinds of interconnects. In addition, a material of the recording layer is such a magnetic material that magnetization at 150° C. is at least 50% of magnetization at a room temperature and magnetization at a temperature in the range from 150° C. to 200° C. is in the range from 10% to 80% of magnetization at a room temperature.

As described above, in the magnetic storage element and the magnetic memory according to the embodiments of the present disclosure, the heat generator to heat the recording layer is provided and such a material that the temperature characteristic of the magnetization has a specific range is used as the material of the recording layer. Specifically, such a material is used that, as this temperature characteristic, magnetization equal to or higher than 50% is obtained at 150° C. and magnetization in the range from 10% to 80% is obtained at a temperature in the range from 150° C. to 200° C. on the basis of the magnetization of the recording layer material at a room temperature.

Employing such a configuration can reduce the current necessary to cause magnetization reversal by spin injection in the magnetic storage element. In this case, it is possible to perform information rewriting by small current while maintaining the information retention characteristic that is stable against thermal fluctuation and so forth.

According to the magnetic storage element and the magnetic memory of the embodiments of the present disclosure, the current necessary to cause magnetization reversal by spin injection can be reduced without the lowering of the information retention characteristic.

DETAILED DESCRIPTION OF THE PREFERRED EMBODIMENTS

Examples of the best mode for carrying out the present disclosure will be described below with reference to the drawings. The order of the description is as follows.
1. First Embodiment of the Present Disclosure (embodiment of magnetic memory)
2. Second Embodiment of the Present Disclosure (embodiment of magnetic storage element)
3. Modification Examples of Second Embodiment of the Present Disclosure
4. Working Examples and Comparative Examples
1. First Embodiment of the Present Disclosure (Embodiment of Magnetic Memory)

Figure 1:
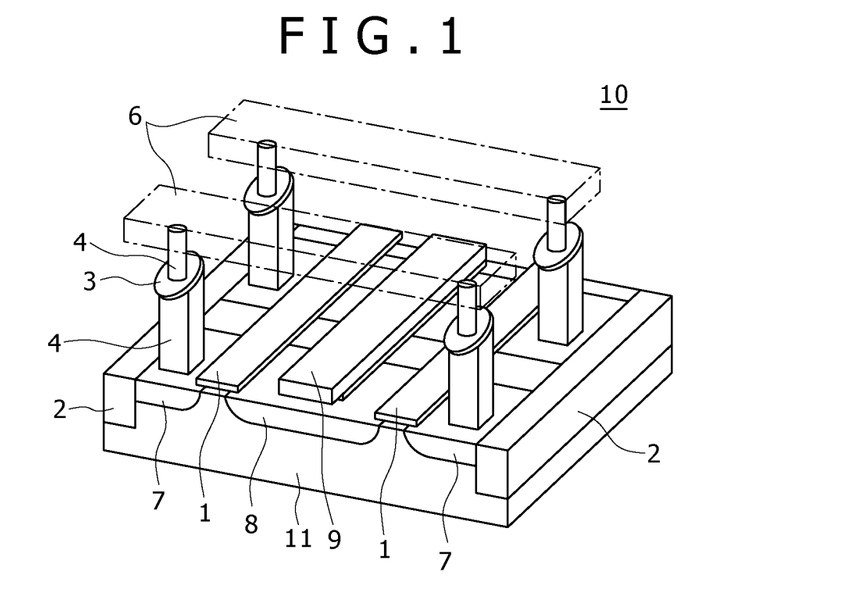
FIG. 1 is a schematic perspective view of the configuration of a magnetic memory according to an embodiment of the present disclosure.

First, as a first embodiment of the present disclosure, an embodiment of a magnetic memory will be described with reference to FIG. 1. As shown in FIG. 1, this magnetic memory 10 includes two kinds of address interconnects intersecting with each other, e.g. word lines and bit lines, and is formed by disposing magnetic storage elements 3 near the intersections of these two kinds of interconnects and between the interconnects. As this magnetic storage element 3, a magnetic storage element according to an embodiment and modification examples to be described later is used.

In this case, in the area isolated by an element isolating layer 2 in a semiconductor substrate 11 composed of e.g. Si, a drain region 8, a source region 7, and a gate electrode 1 are formed. These components configure a selection transistor for selecting the corresponding magnetic storage element 3. The gate electrode 1 serves also as one address interconnect (e.g. word line) extended along the anteroposterior direction in the diagram. The drain region 8 is formed in common to the selection transistors on the left and right sides in the diagram. An interconnect 9 is connected to this drain region 8.

The magnetic storage element 3 is disposed between the source region 7 and the other address interconnect (e.g. bit line) 6 that is disposed on the upper side and extended along the horizontal direction in the diagram. This magnetic storage element 3 includes a recording layer formed of a ferromagnetic layer whose magnetization direction is reversed by spin injection and a heat generator to heat this recording layer. As described in detail for the embodiment of the magnetic storage element to be described later, this recording layer is composed of such a material that the magnetization at 150° C. is at least 50% of the magnetization at a room temperature and the magnetization at a temperature in the range from 150° C. to 200° C. is in the range from 10% to 80% of the magnetization at a room temperature.

This magnetic storage element 3 is disposed near the intersection of the gate electrode 1 and the interconnect 6, which serve as two kinds of address interconnects, and is connected to these interconnects via upper and lower contact layers 4. This makes it possible to apply a current in the vertical direction to the magnetic storage element 3 via two kinds of interconnects, i.e. the gate electrode 1 and the interconnect 6, and reverse the magnetization direction of the recording layer by spin injection corresponding to information.

The existence of the magnetic storage element 3 having the recording layer and the heat generator with the above-described configuration enables this magnetic memory 10 to effectively lower the magnetization of the recording layer in information recording and perform information rewriting by small current with keeping of the information retention characteristic that is stable against thermal fluctuation and so forth.

2. Second Embodiment of the Present Disclosure (Embodiment of Magnetic Storage Element)

Figure 2:
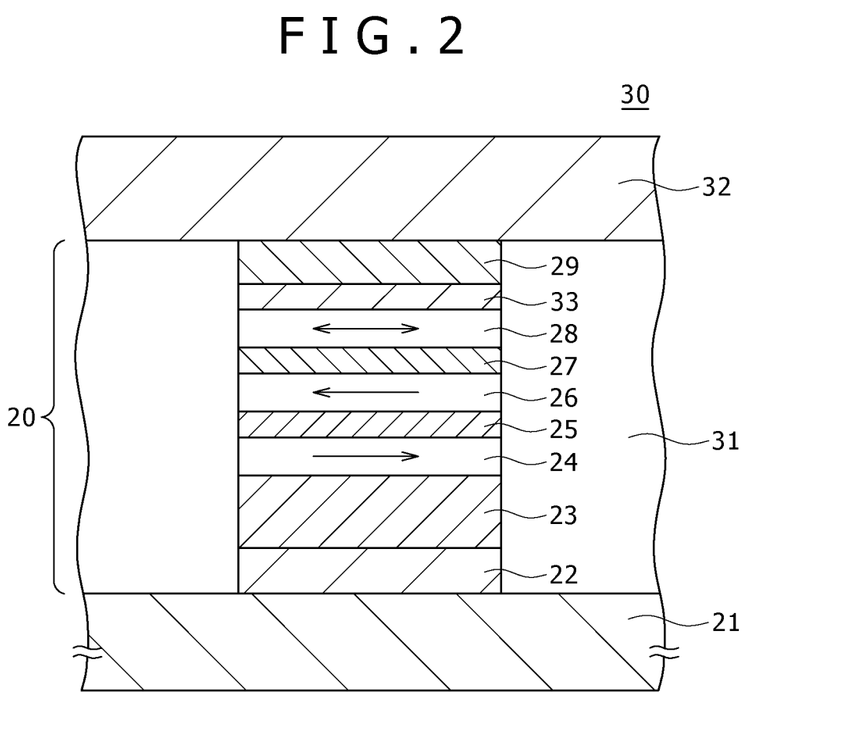
FIG. 2 is a schematic sectional view of the configuration of a magnetic storage element according to the embodiment of the present disclosure.

One example of a magnetic storage element according to an embodiment of the present disclosure will be described below with reference to FIG. 2. As shown in FIG. 2, in this magnetic storage element 30, a base layer 22 composed of e.g. Ta serving also as one of the electrodes and an antiferromagnetic layer 23 composed of e.g. PtMn are formed in that order over a substrate 21 composed of e.g. thermally-oxidized silicon. Furthermore, a reference layer 24 composed of a ferromagnetic material such as CoFe or CoFeB is stacked on the antiferromagnetic layer 23 and the magnetization direction of the reference layer 24 is fixed. Over the reference layer 24, a non-magnetic layer 25 composed of e.g. Ru and a reference layer 26 composed of a ferromagnetic material such as CoFe or CoFeB are formed in that order. In this case, the reference layer 24 and the reference layer 26 are coupled to each other with the intermediary of the non-magnetic layer 25 in such a manner that the magnetization directions of these layers are antiparallel to each other, so that a synthetic ferrimagnetic structure is formed. However, the structure is not limited thereto.

Over the reference layer 26, a recording layer 28 whose magnetization direction changes due to spin injection is formed with the intermediary of an intermediate layer 27 composed of a non-magnetic material. It is preferable to use e.g. a metal material of small spin scattering such as Cu or a ceramic material such as $Al_2O_3$ or MgO as the material of the intermediate layer 27. In particular, using MgO or the like is preferable because a large signal is obtained as a reproduction signal in reading. The material of the recording layer 28 will be described later.

In this magnetic storage element 30, a heat generator 33 formed of e.g. a thermal resistance layer composed of e.g. Ti is formed on the recording layer 28 formed of a ferromagnetic layer. Furthermore, a cap layer 29 composed of e.g. Ta is formed on this heat generator 33, so that a multilayer structure part 20 is configured. The planar shape of this multilayer structure part 20 may be e.g. an elliptical shape as shown in FIG. 1. However, another planar shape may be employed and there is no particular limitation. The periphery of this multilayer structure part 20 is buried in a filling layer 31 composed of a non-magnetic material and the surface of the multilayer structure part 20 is flush with the cap layer 29. On the cap layer 29 and the filling layer 31, an electrode layer 32 to apply a current to the magnetic storage element 30 is formed. In FIG. 2 and FIGS. 3 to 6 to be described later, the direction of the magnetization possessed by a ferromagnetic layer is schematically shown by an arrowhead.

In this magnetic storage element 30, a voltage is applied between the base layer 22 and the electrode layer 32 and a current is applied in a direction perpendicular to the film plane of the magnetic storage element 30 to carry out spin injection, to thereby change the relative angle between the magnetization directions of the recording layer 28 and the reference layer 26. Therefore, in the spin injection through the current application, Joule heat due to the applied current is generated, and the influence of the heat generation exists even when the heat generator 33 is not provided. However, if the same material as that of the related art is used as the magnetic material of the recording layer 28, the ratio of contribution to reduction in the spin injection current by the Joule heat generated in a normal element structure is at an ignorable level. In contrast, reduction in the spin injection current can be realized by using such a magnetic material that the temperature dependence of the magnetic characteristics falls within a specific range as the material of the recording layer 28 and providing the heat generator 33 to aggressively utilize the effect of heat generation.

Specifically, in the present embodiment, as the recording layer 28, such a magnetic material is used that the magnetization at 150° C. is at least 50% of the magnetization at a room temperature and the magnetization at a temperature in the range from 150° C. to 200° C. is in the range from 10% to 80% of the magnetization at a room temperature. Due to the use of such a magnetic material, the magnetization of the recording layer 28 is sufficiently lowered when the current necessary for spin injection magnetization reversal is applied, and the recording current is reduced.

If such a magnetic material that the magnetization is lowered to 80% or lower of the magnetization at a room temperature when the temperature is higher than 200° C. is used as the material of the recording layer 28, the magnetization is not yet sufficiently lowered when the current necessary for spin injection magnetization reversal is applied, and the effect of large reduction in the recording current is not observed. Conversely, if the magnetization of the recording layer 28 is lowered to a value smaller than 50% of the magnetization at a room temperature when the temperature is lower than 150° C., a problem occurs in the information retention characteristic although the effect of reduction in the recording current is obtained. Because the magnetic storage element 30 of the spin injection type is a non-volatile memory, it should retain the recorded information for e.g. ten years in a certain temperature range. Normally the upper limit of the temperature range is about 90° C. to 120° C. although the temperature range changes depending on the use purpose. So, information retention tests were made with use of these temperatures as the upper limit. As a result, it was found that the occurrence rate of an information retention error is not sufficiently decreased if such a magnetic material that the magnetization is lowered to a value smaller than 50% of the magnetization at a room temperature when the temperature is lower than 150° C. is used as the material of the recording layer 28.

If the magnetization of the recording layer 28 becomes lower than 10% of the magnetization at a room temperature when the temperature is in the range from 150° C. to 200° C., magnetization reversal can be induced by small current. However, if such a material that the magnetization becomes extremely low is used as the recording layer 28, the back hopping frequently occurs and it is difficult to stably control the magnetization state of the recording layer 28 (refer to e.g. "Journal of Applied Physics 105, 07D126 (2009)").

So, in the present embodiment, such a magnetic material that the magnetization at 150° C. is at least 50% of the magnetization at a room temperature and the magnetization at a temperature in the range from 150° C. to 200° C. is in the range from 10% to 80% of the magnetization at a room temperature is used as the recording layer 28. Such a temperature characteristic is preferable because it can be easily realized by using a material obtained by combining at least one element of Co and Fe and at least one of a non-magnetic element and an oxide. Examples of the non-magnetic element include Ta, Zr, and V. Examples of the oxide include $SiO_2$, MgO, and Al—O (aluminum oxide). Examples of the magnetic material used as the base include CoFe, CoFeB, and alloys containing these substances.

It is preferable that a material layer having a high thermal resistance rate, such as a Ti layer, be provided as the heat generator 33. If such a thermal resistance material is used as the heat generator 33, heat is generated in a certain range when a current is applied. In addition, the configuration is simple and the manufacturing is also easy.

The magnetic layers used as the reference layers 24 and 26 and the recording layer 28 may be either an in-plane magnetization film or a perpendicular magnetization film. However, when the reference layers 24 and 26 are in-plane magnetization films, an in-plane magnetization film is employed also as the recording layer 28. Conversely, when the reference layers 24 and 26 are perpendicular magnetization films, it is preferable to employ a perpendicular magnetization film also as the recording layer 28. As just described, it is preferable that the magnetization directions of the reference layers 24 and 26 and the recording layer 28 be parallel to each other or anti-parallel to each other.

As for the materials of the respective layers configuring the multilayer structure part 20 except the recording layer 28 and the heat generator 33, the same materials as those in the related-art magnetic storage element of the spin injection type can be used besides the above-described materials. The same applies also to the film thicknesses thereof and the manufacturing method is also not particularly limited. Furthermore, the same applies also to the substrate 21, the filling layer 31, and the electrode layer 32, and the materials and configurations thereof are not particularly limited.

Figure 3:
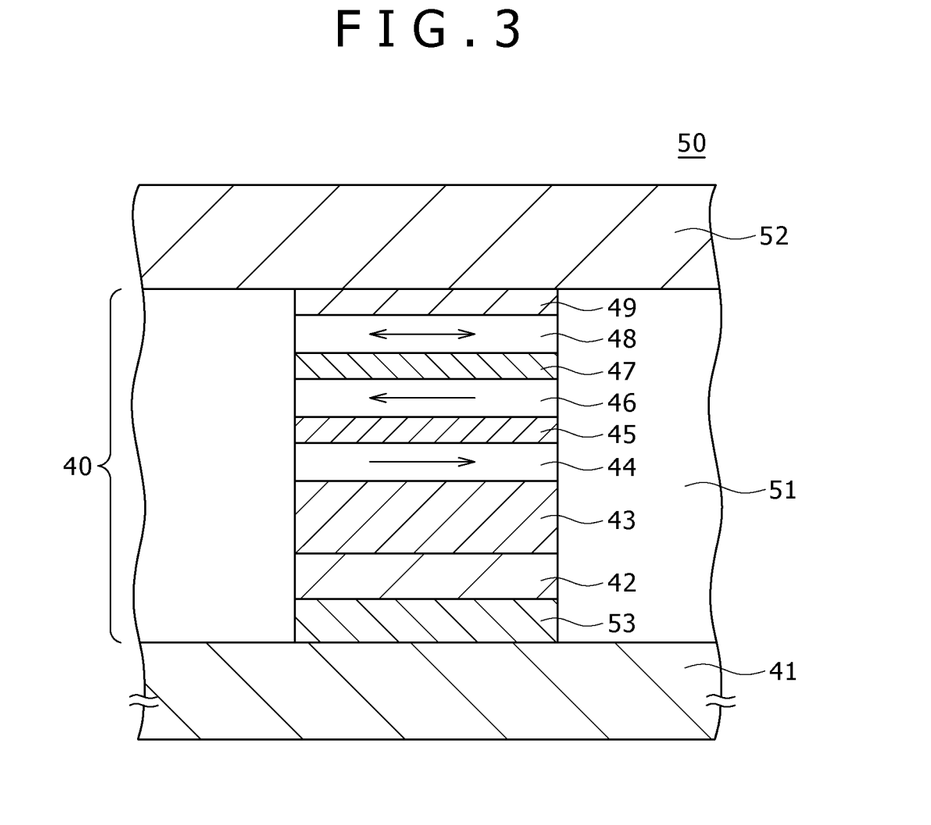
FIG. 3 is a schematic sectional view of the configuration of a modification example of the magnetic storage element according to the embodiment of the present disclosure.

3. MODIFICATION EXAMPLES OF SECOND EMBODIMENT OF THE PRESENT DISCLOSURE (3-1) First Modification Example A first modification example of the magnetic storage element according to the second embodiment will be described below with reference to FIG. 3. As shown in FIG. 3, in this magnetic storage element 50, a heat generator 53 is formed on a substrate 41. Over the heat generator 53, a base layer 42, an antiferromagnetic layer 43, a reference layer 44, a non-magnetic layer 45, a reference layer 46, an intermediate layer 47 formed of a non-magnetic layer, a recording layer 48, and a cap layer 49 are formed in that order. The heat generator 53 is formed of e.g. a thermal resistance layer. The respective layers from the heat generator 53 to the cap layer 49 are formed with e.g. an elliptical shape as their planar shape, so that a multilayer structure part 40 is configured. Furthermore, a filling layer 51 is formed around the multilayer structure part 40 and an electrode layer 52 is formed on the cap layer 49 and the filling layer 51. Also in this example, as the material of the recording layer 48, such a magnetic material is used that the magnetization at 150° C. is at least 50% of the magnetization at a room temperature and the magnetization at a temperature in the range from 150° C. to 200° C. is in the range from 10% to 80% of the magnetization at a room temperature. The materials and film thicknesses of the respective other layers configuring the multilayer structure part 40 except the heat generator 53 may be the same as those of the related-art magnetic storage element of the spin injection type, and the manufacturing method thereof is also not particularly limited. The same applies also to the substrate 41, the filling layer 51, and the electrode layer 52, and the materials and configurations thereof are not particularly limited.

In the examples shown in FIG. 2 and FIG. 3, the reference layers 24, 26, 44, and 46 are disposed closer to the substrates 21 and 41 than the recording layers 28 and 48. However, the structure is not limited thereto. For example, the same characteristics can be achieved also with a reverse structure in which the recording layers 28 and 48 are disposed closer to the substrates 21 and 41 and the reference layers 24, 26, 44, and 46 are disposed closer to the electrode layers 32 and 52 on the upper side.

(3-2) Second Modification Example

Figure 4:
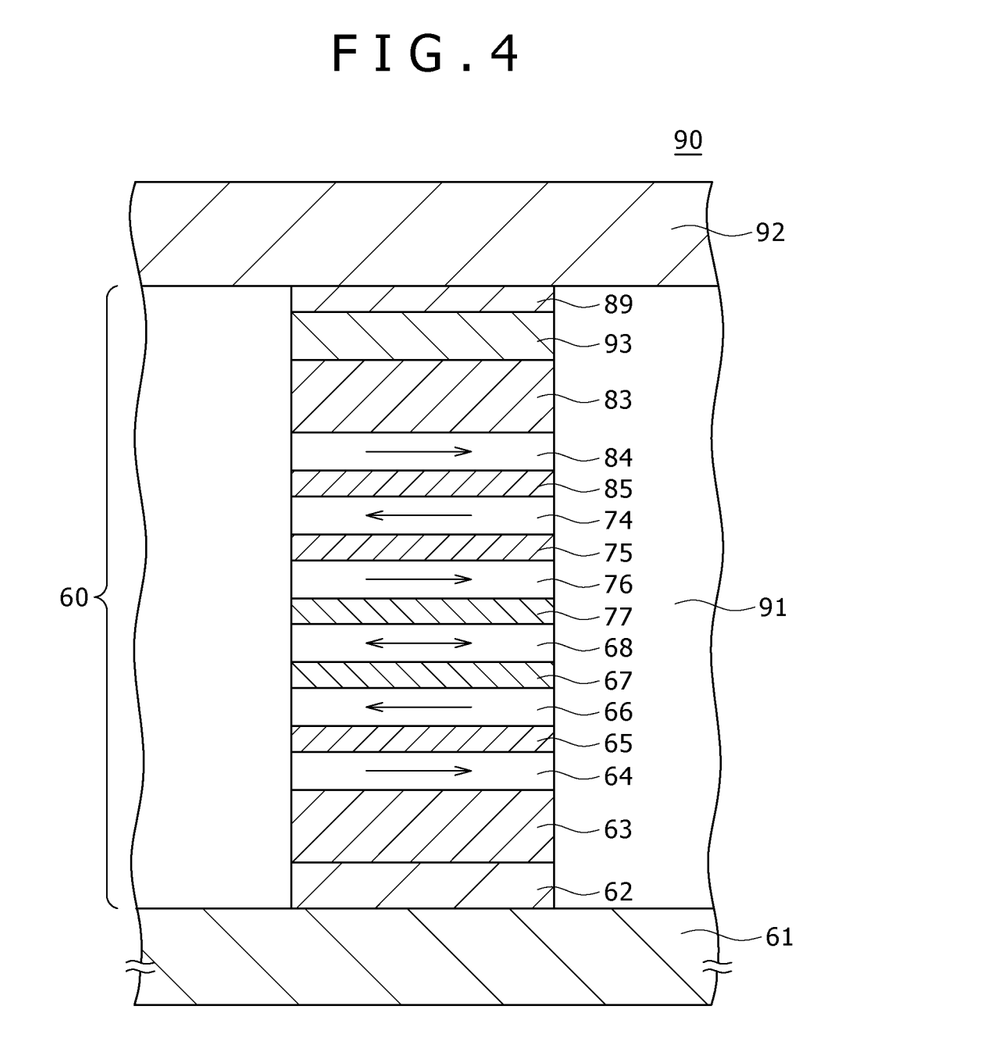
FIG. 4 is a schematic sectional view of the configuration of another modification example of the magnetic storage element according to the embodiment of the present disclosure.

A second modification example of the magnetic storage element according to the second embodiment will be described below with reference to FIG. 4. In the example shown in FIG. 4, a magnetic storage element 90 has a so-called dual configuration in which reference layers 66 and 76 are provided below and over a recording layer 68 with the intermediary of intermediate layers 67 and 77 formed of non-magnetic layers. In this magnetic storage element 90, over a substrate 61, a base layer 62, an antiferromagnetic layer 63, a reference layer 64, a non-magnetic layer 65, the reference layer 66, the intermediate layer 67 formed of a non-magnetic layer, and the recording layer 68 are formed in that order. Furthermore, over the recording layer 68, the intermediate layer 77 formed of a non-magnetic layer, the reference layer 76, a non-magnetic layer 75, a reference layer 74, a non-magnetic layer 85, a reference layer 84, and an antiferromagnetic layer 83 are formed in that order. Over the antiferromagnetic layer 83, a heat generator 93 formed of e.g. a thermal resistance layer is formed. In addition, a cap layer 89 is formed on the heat generator 93, so that a multilayer structure part 60 is configured. A filling layer 91 is formed around the multilayer structure part 60 and an electrode layer 92 is formed on the cap layer 89 and the filling layer 91. Also in this example, as the material of the recording layer 68, such a magnetic material is used that the magnetization at 150° C. is at least 50% of the magnetization at a room temperature and the magnetization at a temperature in the range from 150° C. to 200° C. is in the range from 10% to 80% of the magnetization at a room temperature. The materials and film thicknesses of the respective other layers configuring the multilayer structure part 60 except the heat generator 93 may be the same as those of the related-art magnetic storage element of the spin injection type, and the manufacturing method thereof is also not particularly limited. The same applies also to the substrate 61, the filling layer 91, and the electrode layer 92, and the materials and configurations thereof are not particularly limited.

(3-3) Third Modification Example

Figure 5:
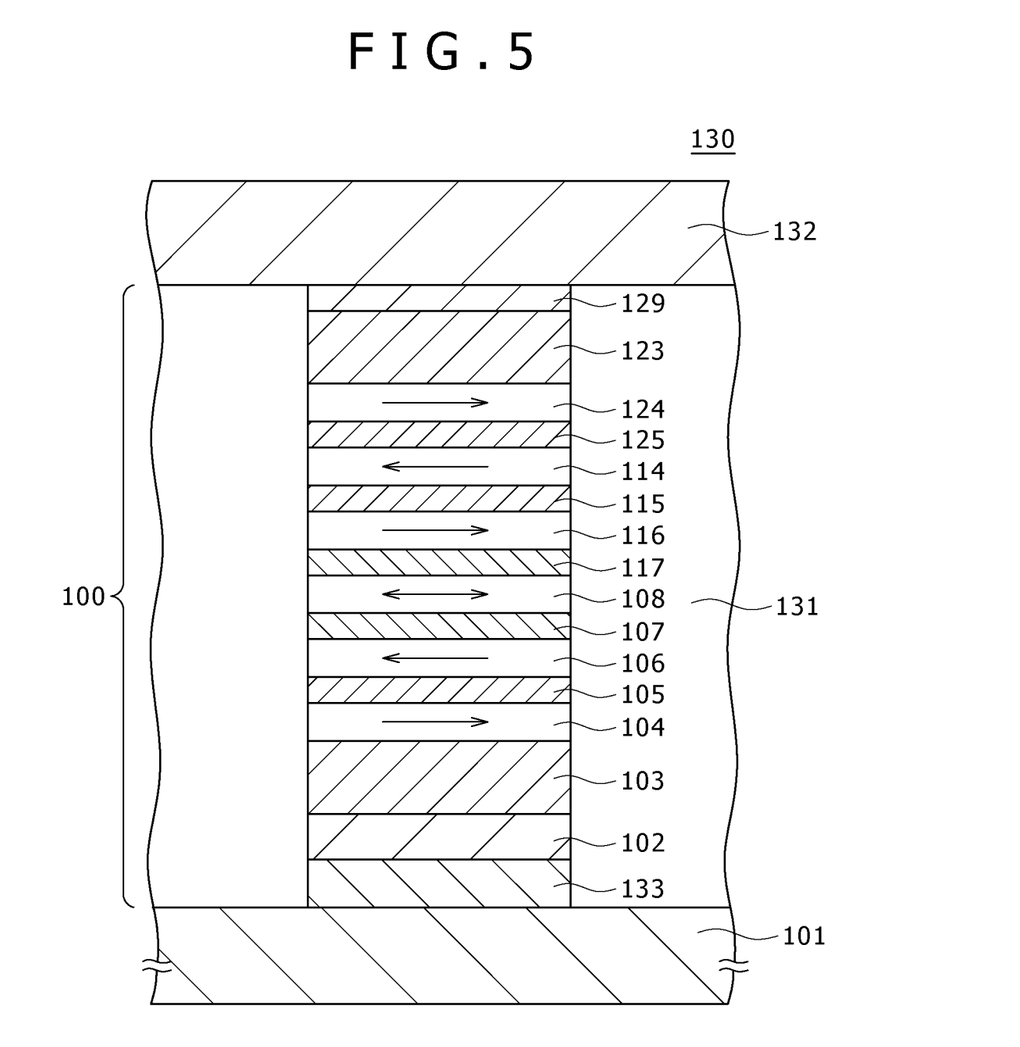
FIG. 5 is a schematic sectional view of the configuration of another modification example of the magnetic storage element according to the embodiment of the present disclosure.

A third modification example of the magnetic storage element according to the second embodiment will be described below with reference to FIG. 5. In the example shown in FIG. 5, a magnetic storage element 130 also has a dual configuration in which reference layers 106 and 116 are provided below and over a recording layer 108 with the intermediary of intermediate layers 107 and 117 formed of non-magnetic layers, similarly to the second modification example. However, a heat generator 133 is provided between a substrate 101 and a base layer 102. In this magnetic storage element 130, over the substrate 101, the heat generator 133 formed of e.g. a thermal resistance layer, the base layer 102, an antiferromagnetic layer 103, a reference layer 104, a non-magnetic layer 105, the reference layer 106, the intermediate layer 107 formed of a non-magnetic layer, and the recording layer 108 are formed in that order. Furthermore, over the recording layer 108, the intermediate layer 117 formed of a non-magnetic layer, the reference layer 116, a non-magnetic layer 115, a reference layer 114, a non-magnetic layer 125, a reference layer 124, and an antiferromagnetic layer 123 are formed in that order. In addition, a cap layer 129 is formed on the antiferromagnetic layer 123, so that a multilayer structure part 100 is configured. A filling layer 131 is formed around the multilayer structure part 100 and an electrode layer 132 is formed on the cap layer 129 and the filling layer 131. Also in this example, as the material of the recording layer 108, such a magnetic material is used that the magnetization at 150° C. is at least 50% of the magnetization at a room temperature and the magnetization at a temperature in the range from 150° C. to 200° C. is in the range from 10% to 80% of the magnetization at a room temperature. The materials and film thicknesses of the respective other layers configuring the multilayer structure part 100 except the heat generator 133 may be the same as those of the related-art magnetic storage element of the spin injection type, and the manufacturing method thereof is also not particularly limited. The same applies also to the substrate 101, the filling layer 131, and the electrode layer 132, and the materials and configurations thereof are not particularly limited.

(3-4) Fourth Modification Example

Figure 6:
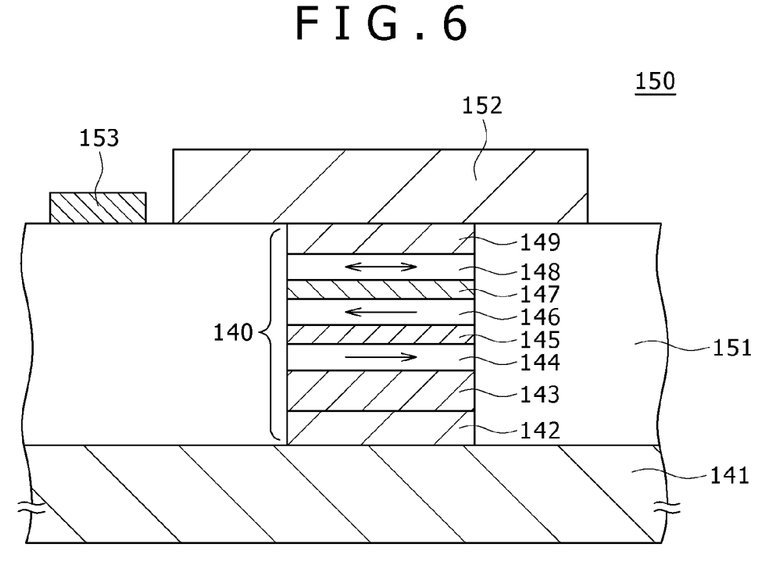
FIG. 6 is a schematic sectional view of the configuration of another modification example of the magnetic storage element according to the embodiment of the present disclosure.

A fourth modification example of the magnetic storage element according to the second embodiment will be described below with reference to FIG. 6. In this example, as shown in FIG. 6, reference layers 144 and 146 are provided on a single side of a recording layer 148 similarly to the examples shown in FIG. 2 and FIG. 3. However, in this example, a heat generator 153 is provided on a filling layer 151 separately from a multilayer structure part 140. In this magnetic storage element 150, over a substrate 141, a base layer 142, an antiferromagnetic layer 143, the reference layer 144, a non-magnetic layer 145, the reference layer 146, an intermediate layer 147 formed of a non-magnetic layer, the recording layer 148, and a cap layer 149 are formed in that order. The respective layers from the base layer 142 to the cap layer 149 are formed with e.g. an elliptical shape as their planar shape, so that the multilayer structure part 140 is configured. Furthermore, the filling layer 151 is formed around the multilayer structure part 140 and an electrode layer 152 is formed on the cap layer 149 and the filling layer 151. Moreover, at a position close to the multilayer structure part 140 on the filling layer 151, the heat generator 153 is formed e.g. at a position adjacent to the electrode layer 152. The heat generator 153 is formed of e.g. a thermal resistance layer. Also in this example, as the material of the recording layer 148, such a magnetic material is used that the magnetization at 150° C. is at least 50% of the magnetization at a room temperature and the magnetization at a temperature in the range from 150° C. to 200° C. is in the range from 10% to 80% of the magnetization at a room temperature. The materials and film thicknesses of the respective other layers configuring the multilayer structure part 140 except the heat generator 153 may be the same as those of the related-art magnetic storage element of the spin injection type, and the manufacturing method thereof is also not particularly limited. The same applies also to the substrate 141, the filling layer 151, and the electrode layer 152, and the materials and configurations thereof are not particularly limited.

In the above-described magnetic storage elements 90 and 130 of the second and third modification examples according to the second embodiment, as the configuration of the reference layers, two magnetic material layers and one non-magnetic material layer are disposed in the lower part (substrate side) and three magnetic material layers and two non-magnetic material layers are disposed in the upper part (opposite side to the substrate). However, the configuration is not limited thereto. The lower part and the upper part may be interchanged, and one magnetic material layer may be employed as the reference layer. Furthermore, the numbers and combination of the magnetic material layers are not particularly limited. For example, the numbers of magnetic material layers of the upper part and the lower part may be one and two, respectively, or three and four, respectively.

In all of the above-described magnetic storage elements 30, 50, 90, 130, and 150 shown in FIGS. 2 to 6, the heat generator is provided in the multilayer structure part or on the filling layer surrounding the multilayer structure part. In any example, heat generated by the heat generator reaches the recording layer and the amount of heat generation per unit current is increased compared with the case of providing no heat generator. Thus, the temperature rise of the recording layer is larger compared with the case of providing no heat generator. Therefore, in spin injection, the magnetization is reduced compared with the magnetization at a room temperature. Thus, for example even when the volume of the recording layer is increased to enhance the information retention characteristic, increase in the spin injection magnetization reversal current can be avoided. This can provide magnetic storage element and magnetic memory in which the spin injection magnetization reversal current is reduced without the lowering of the information retention stability. In the case of the element structure in which the heat generator is provided in the multilayer structure part as shown in FIGS. 2 to 5, the distance between the recording layer and the upper/lower electrode serving as a heat sink is longer and the temperature rise of the recording layer is larger compared with the example shown in FIG. 6. Specifically, in the case of the fourth modification example, in which the heat generator 153 is provided on the filling layer 151 as shown in FIG. 6, the temperature rise of the recording layer 146 is smaller than that in the other examples but the above-described effect due to the temperature rise is sufficiently obtained.

4. WORKING EXAMPLES AND COMPARATIVE EXAMPLES

Working examples and comparative examples of the present disclosure will be described below. First, to confirm the advantageous effect of the embodiments of the present disclosure, recording layers composed of magnetic materials shown in the following Table 1 were fabricated and the temperature dependence of the magnetization was evaluated. Samples 1 to 7 described in Table 1 show the materials configuring the recording layer and the total film thicknesses (unit: nm) of the respective materials.

TABLE 1

| Sample Number | Base Magnetic Material | Non-magnetic Layer | Oxide | Remarks |
|---|---|---|---|---|
| #1 | CoFeB: 2.5 | — | — | comparative example |
| #2 | CoFeB: 3 | Ta: 0.4 | — | working example |
| #3 | CoFeB: 3 | Zr: 0.3 | SiO$_2$: 0.3 | working example |
| #4 | CoFeB: 4 | Ta: 0.5 | MgO: 0.8 | working example |
| #5 | CoFeB: 4 | V: 0.7 | Al—O: 0.3 | working example |
| #6 | CoFeB: 4 | V: 0.5 | — | comparative example |
| #7 | CoFeB: 4 | Ta: 0.5 | SiO$_2$: 0.8 | comparative example |

The composition of CoFeB used as the base magnetic material in samples 1 to 7 is as follows: Co is 40 atomic%, Fe is 40 atomic %, and B is 20 atomic %. However, the recording layer used in the embodiments of the present disclosure is not limited to the material having this composition ratio. Samples 2 to 7 are configured by stacking the base magnetic material and a non-magnetic layer and/or an oxide. The multilayer configurations of the respective samples are as follows. Specifically, regarding the respective samples, the film thicknesses and the numbers of stacked layers about the base magnetic material, the non-magnetic layer, and the oxide, and the multilayer configuration from the substrate side (i.e. the intermediate layer side) are shown. The numeric value in the bracket in the multilayer configuration indicates the film thickness and the unit thereof is nm.

[Sample 2: CoFeB (1 nm)×three layers, Ta (0.2 nm)× two layers]

CoFeB (1)/Ta (0.2)/CoFeB (1)/Ta (0.2)/CoFeB (1)

[Sample 3: CoFeB (1 nm)×three layers, Zr (0.15 nm)× two layers, SiO$_2$ (0.15 nm)×two layers]

CoFeB (1)/SiO$_2$ (0.15)/Zr (0.15)/CoFeB (1)/Zr (0.15)/ SiO$_2$ (0.15)/CoFeB (1)

[Sample 4: CoFeB (1 nm)×four layers, Ta (0.25 nm)× two layers, MgO (0.2 nm)×one layer, MgO (0.3 nm)×two layers]

CoFeB (1)/MgO(0.2)/CoFeB (1)/Ta (0.25)/MgO (0.3)/ CoFeB (1)/MgO (0.3)/Ta (0.25)/CoFeB (1)

[Sample 5: CoFeB (1 nm)×four layers, V (0.3 nm)× one layer, V (0.2 nm)×two layers, Al—O (0.15 nm)×two layers]

CoFeB (1)/Al—O (0.15)/CoFeB (1)/V (0.2)/Al—O (0.15)/V (0.2)/CoFeB (1)/V (0.3)/CoFeB (1)

[Sample 6: CoFeB (1 nm)×four layers, V (0.2 nm)× one layer, V (0.15 nm)×two layers]

CoFeB (1)/V (0.15)/CoFeB (1)/V (0.2)/CoFeB (1)/V (0.15)/CoFeB (1)

[Sample 7: CoFeB (1 nm)×four layers, Ta (0.25 nm)× two layers, SiO$_2$ (0.4 nm)×one layer, SiO$_2$ (0.2 nm)×two layers]

CoFeB (1)/SiO$_2$ (0.2)/Ta (0.25)/CoFeB (1)/SiO$_2$ (0.4)/ CoFeB (1)/Ta (0.25)/SiO$_2$ (0.2)/CoFeB (1)

Figure 7:
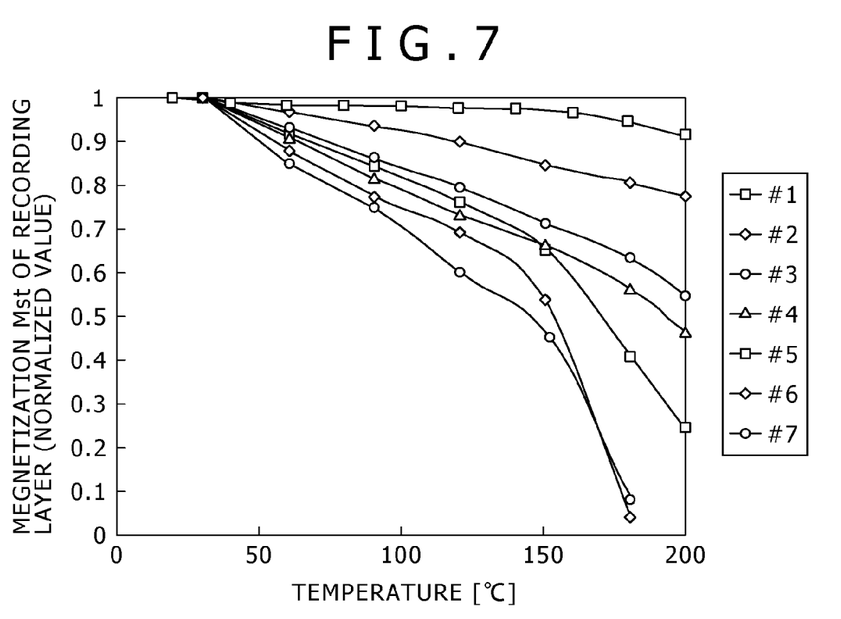
FIG. 7 is a diagram showing the temperature dependence of the magnetization of a recording layer in samples 1 to 7 of the magnetic storage element.

FIG. 7 shows the temperature dependence of the magnetization Mst of the recoding layer in these samples 1 to 7. In the recording layer in samples 2 to 5, the magnetization at 150° C. is at least 50% of the magnetization at a room temperature and the magnetization at a temperature in the range from 150° C. to 200° C. is in the range from 10% to 80% of the magnetization at a room temperature. Thus, the recording layers in samples 2 to 5 correspond to the working examples of the present disclosure. On the other hand, the recording layers in samples 1, 6, and 7 correspond to the comparative examples.

Next, the difference between the case of providing no heat generator and the case of providing the heat generator was investigated for the purpose of confirming the advantageous effect of the embodiments of the present disclosure. For this investigation, the magnetic layer materials of the recording layers in samples 1 to 7 shown in Table 1 were used. As configuration examples of the magnetic storage element, the above-described configurations of FIG. 2, FIG. 3, and FIG. 6 were employed as a configuration "with the heat generator," and the configuration obtained by omitting the heat generator in FIG. 2 was employed as a configuration "without the heat generator." Based on these configuration examples, the spin injection magnetization reversal characteristic was evaluated. The materials and configurations of the respective components are as follows:

Substrate: thermally-oxidized Si substrate
Base layer: Ta, thickness 5 nm
Antiferromagnetic layer: PtMn, thickness 30 nm
Reference layer (lower layer): CoFe, thickness 2 nm
Non-magnetic layer: Ru, thickness 0.8 nm
Reference layer (upper layer): CoFeB, thickness 2 nm
Intermediate layer: MgO, thickness 1.0 nm
Recording layer: configurations in samples 1 to 7 in Table 1
Cap layer: Ta, thickness 5 nm
Electrode layer: Al—Cu, thickness 100 nm
Filling layer: $SiO_2$, thickness 10 to 100 nm As the heat generator, Ti, which is a metal having a low thermal conductivity, was used with a film thickness of 80 nm. When a metal having a low thermal conductivity like Ti is used, large heat generation is obtained. The shape of the multilayer structure part of the magnetic storage element was set to an elliptical shape with a 100-nm-length minor axis and a 200-nm-length major axis.

$$Jc=Ic/A$$

(A: the area of the magnetic storage element (=the cross-sectional area in a direction perpendicular to the film plane))

That is, the following equation (2) is obtained from the above-described equation (1).

$$Jc=\alpha \cdot e \cdot \gamma \cdot Ms \cdot V \cdot H_{eff}/(g \cdot \mu_B \cdot A) \quad (2)$$

In equation (2), $\alpha$ denotes the damping constant. e denotes the charge of an electron. $\gamma$ denotes the gyro constant. Ms denotes the saturation magnetization of the magnetic layer whose magnetization rotates. $H_{eff}$ denotes the effective magnetic field acting on the magnetic layer, such as an anisotropic magnetic field (Ha) due to magnetic anisotropy and an external magnetic field. V denotes the volume of the magnetic layer. g denotes the spin injection efficiency. $\mu_B$ denotes the Bohr magneton.

Figure 8:
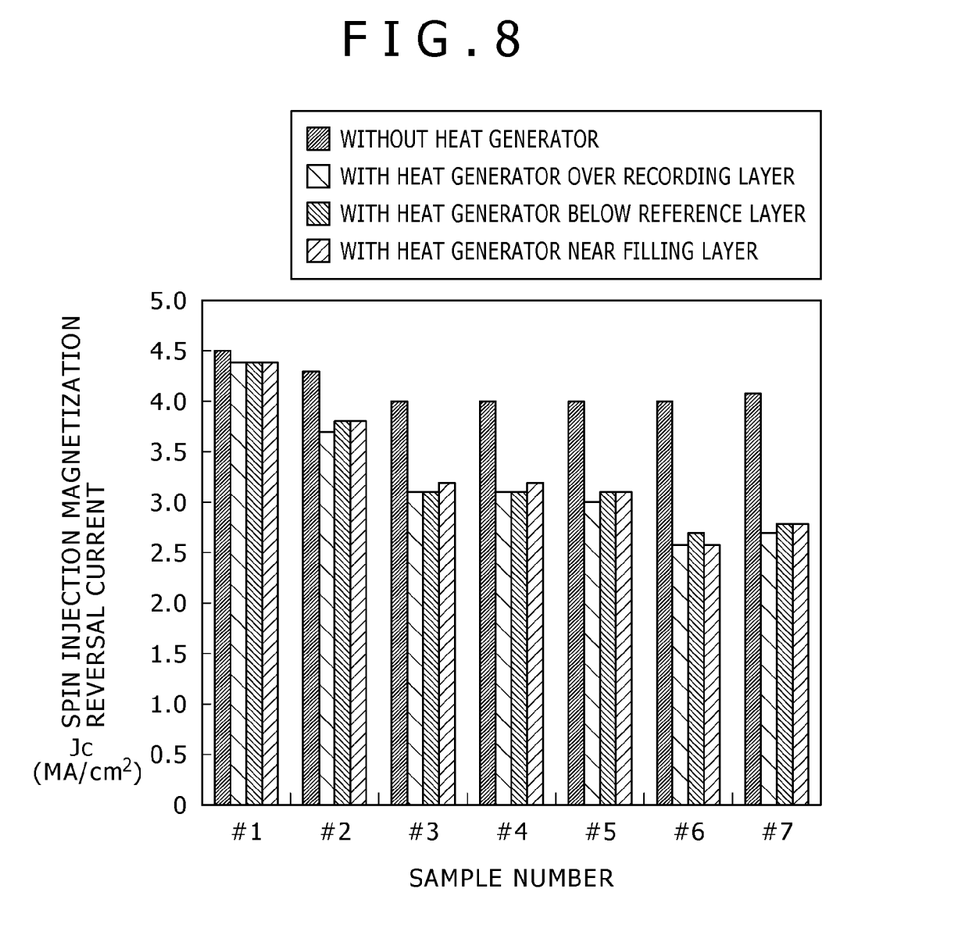
FIG. 8 is a diagram showing the spin injection magnetization reversal current density Jc in samples 1 to 7 of the magnetic storage element on each element structure basis.

In FIG. 8, "WITHOUT HEAT GENERATOR" corresponds to the element structure obtained by omitting the heat generator 33 in the element configuration shown in FIG. 2. "WITH HEAT GENERATOR OVER RECORDING LAYER" corresponds to the element structure shown in FIG. 2. "WITH HEAT GENERATOR BELOW REFERENCE LAYER" corresponds to the element structure shown in FIG. 3. "WITH HEAT GENERATOR NEAR FILLING LAYER" corresponds to the element structure shown in FIG. 6.

From the result of FIG. 8, it turns out that the spin injection magnetization reversal current Jc can be suppressed to 4.0 $MA/cm^2$ or lower in samples 2 to 5, which correspond to the working examples of the present disclosure. In these samples 2 to 5, the magnetization in spin injection is reduced and the spin injection magnetization reversal current can be reduced. It turns out that particularly in the element structure in which the heat generator is provided in the multilayer structure part, the spin injection current is reduced compared with the case of providing the heat generator on the filling layer. Furthermore, it turns out that the spin injection magnetization reversal current density Jc can be decreased at the most degree in the element configuration in which the heat generator is provided over the recording layer.

The material of the recording layer used in samples 1 to 7 was so adjusted that the thermal stability index $\Delta$ fell within the range of 50 to 55. In the spin injection magnetization reversal current density Jc of the recording layer in sample 1, large change dependent on the element structure is not found. In contrast, in the recording layer in samples 2 to 7, the spin injection magnetization reversal current density Jc in the element structure including the heat generator is decreased by at least 10% compared with the element structure including no heat generator, so that the advantageous effect of the embodiments of the present disclosure is confirmed.

As another experiment, the information retention rate under a 120° C. environment and the occurrence rate of back hopping were measured regarding samples 1 to 7. The experimental result is shown in the following Table 2.

TABLE 2

| Sample Number | Information Retention Rate under 120° C. Environment | Occurrence Rate of Back Hopping | Remarks |
|---|---|---|---|
| #1 | ~100% | <1% | comparative example |
| #2 | ~100% | <1% | working example |
| #3 | ~100% | <1% | working example |
| #4 | ~100% | <1% | working example |
| #5 | ~100% | <1% | working example |
| #6 | ~99.9% | 13% | comparative example |
| #7 | ~80% | 13% | comparative example |

According to the result of FIG. 8, the spin injection magnetization reversal current density Jc can be decreased also in samples 6 and 7. However, as is apparent from Table 2, the information retention rate is lowered and the occurrence rate of back hopping is increased in samples 6 and 7. That is, it turns out that the controllability of the magnetization reversal behavior is deteriorated in samples 6 and 7. In view of the above-described result and the result about the temperature dependence shown in FIG. 7, it turns out that it is preferable for the magnetic material of the recording layer to have the following temperature characteristic. Specifically, it is preferable to use, as the recording layer, such a magnetic material that the magnetization at 150° C. is at least 50% of the magnetization at a room temperature and the magnetization at a temperature in the range from 150° C. to 200° C. is in the range from 10% to 80% of the magnetization at a room temperature. Using a magnetic material having such a temperature characteristic as the recording layer can decrease the magnetization in spin injection by heating from the heat generator and thereby suppress increase in the spin injection magnetization reversal current Ic even when the film thickness is increased to some extent in order to maintain the information retention characteristic. The recording layer material from which such a temperature characteristic is obtained is not limited to the materials and configurations in the above-described samples 2 to 5. It should be obvious that the material and composition ratio of the base magnetic material, the materials and film thicknesses of the non-magnetic material and the oxide, and the number of stacked layers and the multilayer configuration can be properly changed and the same advantageous effect can be achieved as long as a material having the above-described temperature dependence of the magnetization is employed.

The present disclosure contains subject matter related to that disclosed in Japanese Priority Patent Application JP 2010-150179 filed in the Japan Patent Office on Jun. 30, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A magnetic storage element comprising:
a reference layer configured to have a magnetization fixed in a predetermined direction;
a recording layer configured to have a magnetization the direction of which changes due to spin injection in a direction corresponding to recording information;
an intermediate layer configured to separate the recording layer from the reference layer; and
a heat generator configured to heat the recording layer, wherein,
a material of the recording layer is such a magnetic material that magnetization at 150° C. is at least 50% of magnetization at a room temperature and magnetization at a temperature in a range from 150° C. to 200° C. is in a range from 10% to 80% of magnetization at a room temperature.

2. The magnetic storage element according to claim 1, wherein
the material of the recording layer is a material obtained by combining at least one element of Co and Fe and at least one of a non-magnetic element and an oxide.

3. The magnetic storage element according to claim 1, wherein
the heat generator is a thermal resistance layer stacked in a multilayer structure including the reference layer, the intermediate layer, and the recording layer.

4. The magnetic storage element according to claim 1, wherein the recording layer is between the intermediate layer and the heat generator layer.

5. The magnetic storage element according to claim 1, wherein the heat generator is stacked on an opposite side to a side on which the intermediate layer is between the reference layer and the heat generator layer.

6. The magnetic storage element according to claim 1, wherein
the heat generator is provided on a filling layer in which a multilayer structure including the reference layer, the intermediate layer, and the recording layer is buried.

7. A magnetic memory comprising:
a magnetic storage element configured to include a reference layer having a magnetization direction fixed to a predetermined direction, a recording layer having a magnetization direction that changes due to spin injection in a direction corresponding to recording information, an intermediate layer that separates the recording layer from the reference layer, and a heat generator that heats the recording layer; and
two kinds of interconnects configured to intersect with each other,
wherein,
the magnetic storage element is disposed near an intersection of the two kinds of interconnects and between the two kinds of interconnects, and
a material of the recording layer is such a magnetic material that magnetization at 150° C. is at least 50% of magnetization at a room temperature and magnetization at a temperature in a range from 150° C. to 200° C. is in a range from 10% to 80% of magnetization at a room temperature.

* * * * *